United States Patent [19]
Imanishi et al.

[11] Patent Number: 5,568,140
[45] Date of Patent: Oct. 22, 1996

[54] HEADER DETECTOR AND ASSOCIATED DECODING APPARATUS

[75] Inventors: Hiroshi Imanishi; Eiji Miyagoshi, both of Osaka; Hiroshi Takeno, Kyoto, all of Japan

[73] Assignee: Matsushita Electric Industrial Co., Ltd., Kadoma, Japan

[21] Appl. No.: 364,095

[22] Filed: Dec. 27, 1994

[30] Foreign Application Priority Data

Dec. 28, 1993 [JP] Japan .................................. 5-337234

[51] Int. Cl.⁶ .................................................. H03M 7/40
[52] U.S. Cl. ................................................... 341/67
[58] Field of Search .................................. 341/67, 63, 64, 341/65, 51, 107

[56] References Cited

U.S. PATENT DOCUMENTS 4,899,149  2/1990  Kahan .

5,245,338  9/1993  Sun .

Primary Examiner—Brian K. Young
Attorney, Agent, or Firm—McDermott, Will & Emery

[57] ABSTRACT

A code sequence includes a header code consisting of a series n 0 bits terminated by a 1 bit. A shifter outputs the code sequence in bit strings. Each bit string is made up of plural bits. A priority encoder performs arithmetic operation to count the number of consecutive 0 bits from the most significant bit of each bit string. An accumulator adds the results found by the priority encoder. A comparator compares the sum found by the accumulator with a set value n. The comparator outputs a coincidence signal if these two values are found equal. The priority encoder outputs a 1-bit-inclusion indication signal if a bit string includes a 1 bit. Upon receipt of the coincidence signal and the 1-bit-inclusion indication signal, a first AND circuit outputs a header detection signal. As a result of such arrangement, the code sequence is processed in units of plural bits, whereupon high-speed header code detection is accomplished without requiring the shifter and the accumulator, both of which are components of a header detector, to operate at high speed.

14 Claims, 10 Drawing Sheets

100 BUFFER

FIG. 3(a) SEQUENCE | PICTURE | PICTURE | ... | PICTURE | PICTURE |

FIG. 3(b) PICTURE | SLICE | SLICE | ... | SLICE | SLICE |

FIG. 3(c) SLICE

FIG. 4 | HEADER CODE | vlc1 | vlc2 | vlc3 | ... |

FIG. 7

| INPUT | OUTPUT 1<br>(0-COUNT SIGNAL) | OUTPUT 2<br>(1-INCL. SIGNAL) |
|---|---|---|
| 1 x x x | 0 | 1 |
| 0 1 x x | 1 | 1 |
| 0 0 1 x | 2 | 1 |
| 0 0 0 1 | 3 | 1 |
| 0 0 0 0 | 4 | 0 |

FIG. 8

CODE STRING

< HEADER CODE >< FIRST CODE > ..........
00001000001000000010..........
< 1 >< 2 >
      < 3 >< 4 >
           < 5 >< 6 >
                  < 7 >

| CYCLE | SHIFTER OUTPUT | 0 COUNT | REGISTER | ADDER | CARRY | COMPARATOR | 1-INCL. SIGNAL | HEADER DETECTION SIGNAL |
|---|---|---|---|---|---|---|---|---|
| 1 | 0000 | 4 | 0 | 4 | 0 | 0 | 0 | 0 |
| 2 | 1000 | 0 | 4 | 4 | 0 | 0 | 1 | 0 |
| 3 | 0000 | 4 | 0 | 4 | 0 | 0 | 0 | 0 |
| 4 | 0100 | 1 | 4 | 5 | 0 | 0 | 1 | 0 |
| 5 | 0000 | 4 | 0 | 4 | 0 | 0 | 0 | 0 |
| 6 | 0001 | 3 | 4 | 7 | 0 | 1 | 1 | 1 |
| 7 | 0xxx | | | | | | | |

FIG. 10

| INPUT | OUTPUT 1<br>(0-COUNT SIGNAL) | OUTPUT 2<br>(1-INCL. SIGNAL) |
|---|---|---|
| 1 0 0 0 | 3 | 1 |
| x 1 0 0 | 2 | 1 |
| x x 1 0 | 1 | 1 |
| x x x 1 | 0 | 1 |
| 0 0 0 0 | 4 | 0 |

FIG. 11

CODE STRING

<HEADER CODE>< FIRST CODE .....

0000 1000 0010 0000 0010 .....
<1>  <2>  <3>  <4>  <5>

<6>

| CYCLE | SHIFTER OUTPUT | 0 COUNT (UPPER SIDE) | 0 COUNT (LOWER SIDE) | REGISTER | ADDER | CARRY | COMPARATOR | 1-INCL. SIGNAL | HEADER DETECTION SIGNAL |
|---|---|---|---|---|---|---|---|---|---|
| 1 | 0000 | 4 | 4 | 0 | 4 | 0 | 0 | 0 | 0 |
| 2 | 1000 | 0 | 3 | 4 | 4 | 0 | 0 | 1 | 0 |
| 3 | 0010 | 2 | 1 | 3 | 5 | 0 | 0 | 1 | 0 |
| 4 | 0000 | 4 | 4 | 1 | 5 | 0 | 0 | 0 | 0 |
| 5 | 0010 | 2 | 1 | 5 | 7 | 0 | 1 | 1 | 1 |
| 6 | 0xxx | | | | | | | | |

FIG. 12

CODE STRING

```
<HEADER CODE><  FIRST CODE  .....
0010 0000 0000 1000 .....
<1><2> <3> <4> <5>
             <6>
```

| CYCLE | SHIFTER OUTPUT | 0 COUNT (UPPER SIDE) | 0 COUNT (LOWER SIDE) | REGISTER | ADDER | CARRY | COMPARATOR | 1-INCL. SIGNAL | HEADER DETECTION SIGNAL |
|---|---|---|---|---|---|---|---|---|---|
| 1 | 0010 | 2 | 1 | 0 | 2 | 0 | 0 | 1 | 0 |
| 2 | 0000 | 4 | 4 | 1 | 5 | 0 | 0 | 0 | 0 |
| 3 | 0000 | 4 | 4 | 5 | 2(9-7) | 1 | 0 | 0 | 0 |
| 4 | 0000 | 4 | 4 | 2 | 6 | 1 | 0 | 0 | 0 |
| 5 | 1000 | 0 | 3 | 6 | 6 | 1 | 0 | 1 | 1 |
| 6 | 000x | | | | | | | | |

HEADER DETECTOR AND ASSOCIATED DECODING APPARATUS

BACKGROUND OF THE INVENTION

This invention relates to a header detector capable of detecting the head of a code contained in a code sequence, and to an associated decoding apparatus.

As transmission media and storage media have been digitized, devices such as encoders and decoders have been used increasingly. For example, variable-length decoding apparatus employ a header detector capable of detecting a header code contained in an input code sequence and locating the head of a code following the header code thus detected.

A conventional header detector will now be described below. A header code used here consists of a series of n 0 bits terminated by a single 1 bit.

The operation of the conventional header detector is explained. An incoming code sequence is outputted in units of one bit. Each one bit outputted is checked for whether it is a 0 bit or a 1 bit by a comparator. An accumulator accumulates 0 bits outputted in series, and the number of such consecutive 0 bits is compared with the set value (=n). If n 0 bits are outputted in series and the subsequent bit is a 1 bit, then this bit string (i.e., 0000 . . . 0, 1) is judged to be a header code. In other words, a bit string, composed of a series of n 0 bits terminated by a single 1 bit, is a header code. Additionally, a bit string, composed of n+1 or more 0 bits terminated by a single 1 bit, is also judged to be a header code.

If the output of the accumulator is less than n and the next bit is judged by the comparator to be a 1 bit, the accumulator is reset to zero. Each bit is outputted in synchronism with a clock signal.

The above-described conventional header detector has some drawbacks. For example, a code sequence is processed in units of one bit. In other words, when detecting a header code, the same number of clock cycles as the number of bits forming the header code is required. The speeds of a shifter and an accumulator together forming a header detector ill-influence the rate of retrieval of the header code, and the header-code retrieval rate cannot be increased.

When forming a decoder with the above-described conventional header detector, another problem is produced. Since the conventional header detector provides a code sequence in units of one bit, when shifting out a code already decoded, the same number of clock cycles as the length of the already-decoded code is required. As a result, decoding by the decoder is limited by the speed of the header detector. Therefore high-speed decoding cannot be performed.

SUMMARY OF THE INVENTION

Bearing in mind the above-described problems with the prior art technique the present invention was made. Accordingly it is a general object of the present invention to provide an improved technique capable of performing header code detection operations at high speed, without requiring components forming a header detector to operate at high speed. It is another object of the present invention to provide an improved decoding apparatus implemented by a header detector of the present invention, in order to accomplish high-speed decoding operation.

In the present invention, with a view to achieving the aforesaid objects, a code sequence is outputted in units of plural bits (i.e., in bit strings). Even when a header code extends from a bit string to another, the header coder can be detected without fail whereupon the detection of the header code can be performed at high speed.

The present invention provides an improved header detector. This header detector comprises:

a shifter for receiving a code sequence and outputting the code sequence in units of a plurality of bits, each unit forming a bit string;

a detection means for:

receiving each 0-bit string from the shifter;

outputting a 0-bit-count indication signal indicative of the number of consecutive 0 bits from a most significant bit of each bit string; and detecting whether or not each bit string includes a 1 bit and outputting a detection-result indication signal indicative of a result of the detection operation;

an accumulator for receiving each 0-bit-count indication signal and accumulating numbers represented by the 0-bit-count indication signals to produce an accumulating total;

a comparator for receiving the accumulating total from the accumulator, and comparing the accumulating total with a set value corresponding to a header code to be detected and outputting a compare-result indication signal indicative of a result of the compare operation; and an outputting means for outputting a header detection signal on the basis of the compare-result indication signal from the comparator and the detection-result indication signal from the detection means.

The present invention provides another header detector. This header detector comprises:

a shifter for receiving a code sequence and outputting the code sequence in units of a plurality of bits, each unit forming a bit string;

a detection means for:

receiving each bit string from the shifter;

outputting a first 0-bit-count indication signal indicative of the number of consecutive 0 bits from a most significant bit of each bit string and a second 0-bit-count indication signal indicative of the number of: consecutive 0 bits from a least significant bit of each bit: string; and detecting whether or not each the bit string includes a 1 bit and outputting a detection-result indication signal indicative of a result of the detection operation;

an accumulator for receiving each 0-bit-Count indication signal and accumulating numbers represented by the 0-bit-count indication signals to produce an accumulating total;

a comparator for receiving the accumulating total from the accumulator, and comparing the accumulating total with a set value corresponding to a header code to be detected and outputting a compare-result indication signal indicative of a result of the compare operation; and an outputting means for outputting a header detection signal on the basis of the compare-result indication signal from the comparator and the detection-result indication signal from the detection means;

wherein the accumulator takes, as its initial value, either the accumulating total when receiving the detection-result indication signal indicative of the absence of a 1 bit, or a number represented by the second 0-indication signal when receiving the detection-result indication signal indicative of the presence of a 1 bit.

The present invention provides an improved decoding apparatus which employs either one of the above-described header detectors, and a decoder. In this decoding apparatus, the decoder is activated by a header detection signal from the outputting means, starts decoding a code from the shifter, and outputs a code-length signal indicative of the length of the code, and the shifter takes the code-length signal from the decoder as an incremental shift-amount.

How the header detector of the present invention works will now be described. A code sequence is inputted into the shifter. In response, the shifter outputs the code sequence in units of plural bits (i.e., in bit strings), to the detection means. In response, the detection means counts the number of consecutive 0 bits from the most significant bit of each bit string and makes a check for the presence or absence of a 1 bit in each bit string. The accumulator accumulates numbers found by the detection means to produce an accumulating total. The comparator compares the accumulating total with a set value (i.e., the number of 0 bits contained in a header code to be detected). Such arrangement permits the outputting means to output a header detection signal on the basis of the compare-result indication signal from the comparator and the detection-result indication signal from the detection means indicative of the presence of a 1 bit.

In the present invention, the code sequence is outputted in units of plural bits from the shifter to the detection means, and the detection means counts the number of consecutive 0 bits contained in one unit. Therefore, compared with a prior art technique in which each bit is checked for whether it is a 0 bit or a 1 bit, the present invention provides high-speed header code detection operation, without requiring the shifter and the accumulator to operate at high speed.

Further, in accordance with the header detector of the invention, when a bit string, outputted from the shifter, is found to include therein a 1 bit, the accumulator takes the number of consecutive 0 bits from the least significant bit of that bit string and stores same. Thereafter, every time the detector finds that an incoming bit string does not include a 1 bit, the accumulator adds the number of consecutive 0 bits from the most significant bit of the incoming bit string, to the stored number. The sum found is compared by the comparator with the set value. Such arrangement permits the outputting means to output a header detection signal on the basis of the compare-result indication signal from the comparator and the detection-result indication signal from the detection means indicative of the presence of a 1 bit.

Further, in accordance with the decoding apparatus of the present invention, the decoder inputs a bit string from the shifter of the header detector; however, it is not until the header detector outputs a header detection signal to the decoder that the decoder is activated. Then each bit string outputted from the header detector is decoded by the decoder. The decoder outputs the length of a code decoded and this code length serves as an incremental shift-amount for the shifter, so that every time a code is decoded the shifter shifts out the decoded code for one clock and outputs the next code. Compared with a conventional technique in which each code is shifted out for every one bit, the present invention enables the shifter to provide codes at a higher speed. As a result, high-speed decoding can be performed.

BRIEF DESCRIPTION OF THE ACCOMPANYING DRAWINGS

The invention will be better understood from the following description of its preferred embodiments when considered with the accompanying drawing figures.

FIG. 1 shows the entire decoding apparatus of the first preferred embodiment.

FIG. 2 roughly shows a buffer of the first preferred embodiment.

FIG. 3(a) to (c) are is a diagram roughly showing an MPEG code sequence.

FIG. 4 is a diagram roughly showing a code sequence in the first preferred embodiment.

FIG. 5 roughly shows a decoder of the first preferred embodiment.

FIG. 7 is a truth table for a priority encoder of the first preferred embodiment.

FIG. 8 is a time chart for describing the operation of a header detector of the first preferred embodiment.

FIG. 10 is a truth table for a priority encoder of the second preferred embodiment.

FIG. 11 is a time chart for describing a way of detecting a header code according to the operation of a comparator of the second preferred embodiment.

FIG. 12 is a time chart for describing a way of detecting a header code according to the output (carry signal) of an adder of the second preferred embodiment.

DETAILED DESCRIPTION OF THE INVENTION

Preferred embodiments of the present invention will now be described below by making reference to the accompanying drawing figures.

PREFERRED EMBODIMENT 1

Figure 1:
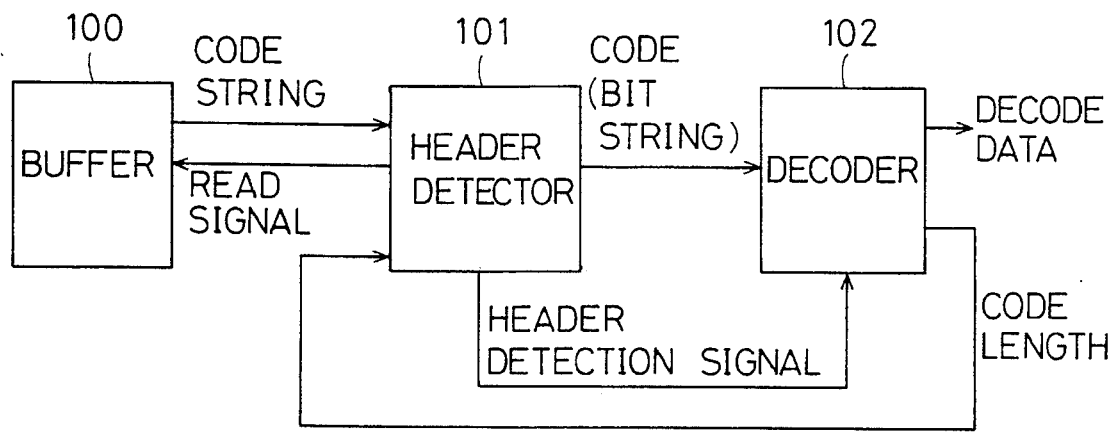

FIG. 1 illustrates a decoding apparatus in accordance with the present invention. This decoding apparatus has a buffer 100, a header detector 101, and a decoder 102. The header detector 101 generates a read signal to the buffer 100. In response, the buffer 100 outputs a code sequence to the header detector 101. Upon receipt of the code sequence from the buffer 100, the header detector 101 performs a detection operation to recognize a header code contained in the code sequence. When it detects a header code, the header detector 101 generates a header detection signal to the decoder 102 and outputs a code following the header code detected. The decoder 102 is activated upon receipt of the header detection signal from the header detector 101, decodes the code from the header detector 101, and outputs the decoded data.

Figure 2:
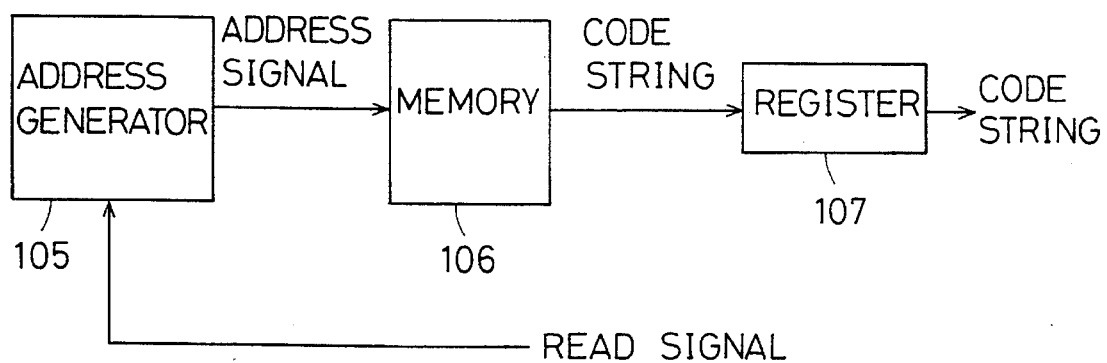

As depicted in FIG. 2, the buffer 100 is made up of an address generator 105, a memory 106, and a register 107. The memory 106 is segmented to store a code sequence by a predetermined number of bits and each segmentation is assigned a respective address. In response to the read signal from the header detector 101, the address generator 105 adds 1 to the existing address to generate the next address. Upon receipt of an address signal from the address generator 105, the memory 106 outputs a corresponding bit string. The register 107, while storing such a bit string from the memory 106, outputs same to the header detector 101.

In the MPEG (for Motion Picture Image Coding Experts Group) standards for image compression coding, a code sequence is composed of a plurality of pictures (see FIG.

3a). One picture is composed of a plurality of slices (see FIG. 3b). The slice is the smallest element of the code sequence (see FIG. 3c). A header code (not shown) is placed at the head of each of the code sequence, the picture, and the slice.

According to the invention, a code sequence is divided into two parts, a header code and a plurality of variable-length codes vlc1, vlc2, vlc3 . . . (see FIG. 4). In accordance with the MPEG standards, an actual header code is a single code composed of a series of 23 or more 0 bits terminated by a single 1 bit.

Figure 5:
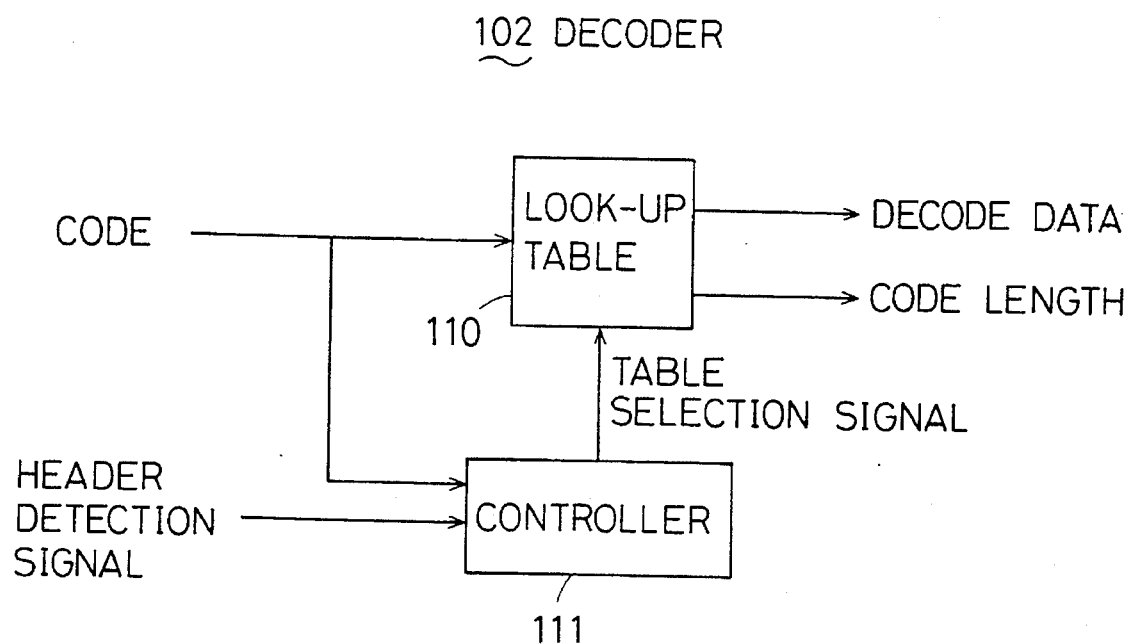

The decoder 102 of FIG. 1 has a look-up table 110 and a controller 111 (see FIG. 5). The look-up table 110 has various look-up tables depending on the variable-length code type. A great number of variable-length codes are associated with corresponding decoding data and code lengths for storage in each look-up table. The controller 111 is activated by a header detection signal from the header detector 101, The controller 111 receives a code from the header detector 101 thereby generating to the look-up table 110 arable selection signal corresponding the received code. In response, the look-up table 110 selects a corresponding look-up table from among the plural look-up tables, receives a code from the header detector 101, retrieves data and a code length corresponding to the received code from the selected look-up table, and outputs them.

As shown in FIG 1, the header detector 101 receives a code length from the decoder 102 thereby shifting out a bit or bits by the received code length. Accordingly, the header detector 101 outputs a bit string following the aforesaid decoded code as the next output.

Figure 6:
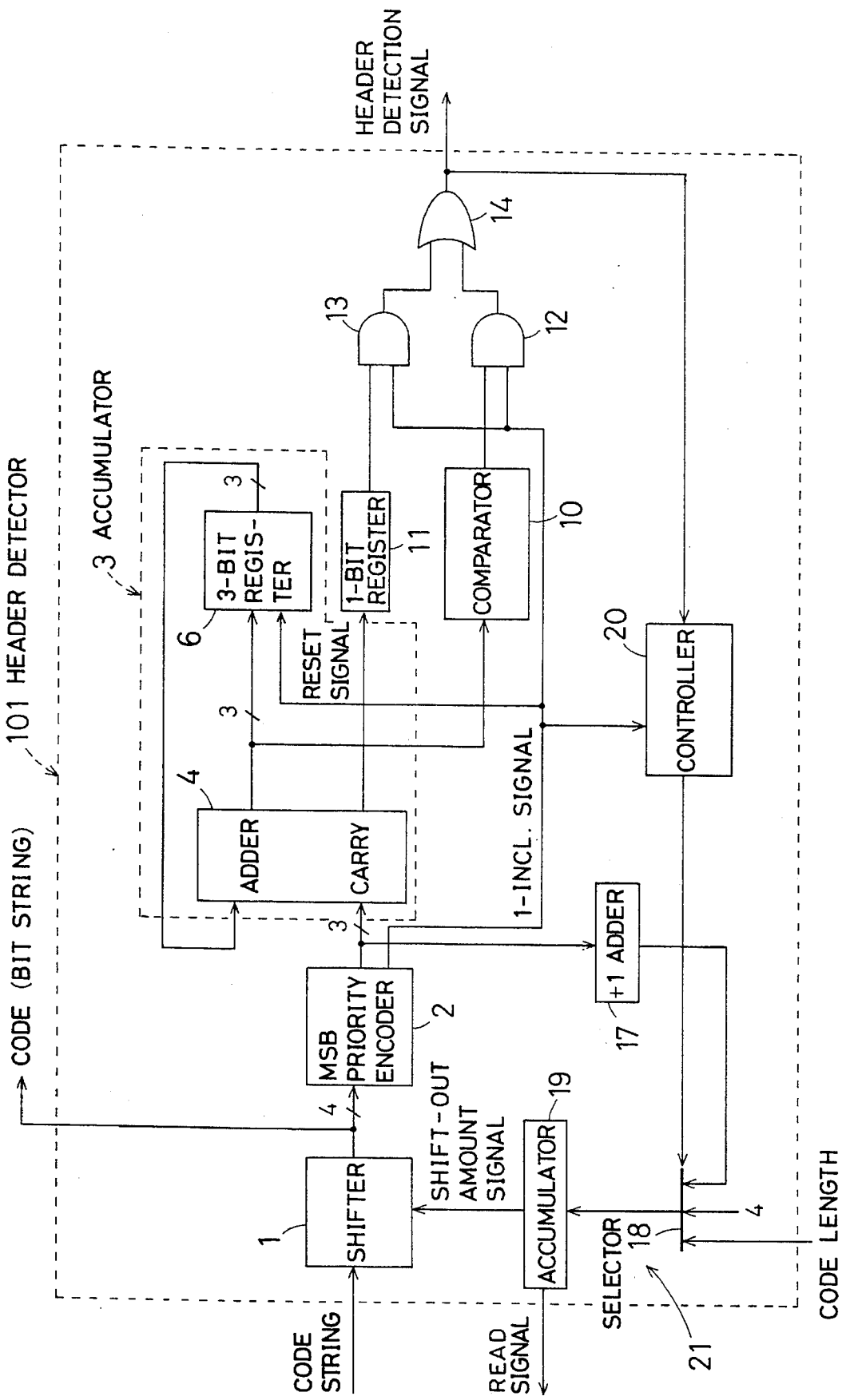
FIG. 6 shows a header detector of the first preferred embodiment.

The header detector 101 will be described by reference to FIG. 6. 1 indicates a shifter. This shifter 1 inputs a predetermined number of bits (e.g., 8 bits from the head of a code sequence). Having received a signal indicative of the amount of shift to be performed (hereinafter called the shift-amount signal), the shifter 1 performs a shift-out operation according to the received shift-amount signal and outputs a bit string of plural bits following; the shifted-out bit or bits. The output of the shifter 1 is supplied to the decoder 102.

2 is a priority encoder as a detection means. This priority encoder 2 inputs a bit string from the shifter and counts the number of consecutive 0 bits from a most significant bit (MSB) of the bit string (see the FIG. 7 truth table). The priority encoder 2 then outputs a signal indicative of the number of consecutive 0 bit is found thereinafter called the 0-bit-count indication signal). At the same time, the priority encoder 2 outputs a signal (hereinafter called the 1-bit-inclusion indication signal) if the bit string inputted includes a 1 bit. In the truth table of FIG. 7, "x" represents an arbitrary value (1 or 0) following a 1 bit.

3 is a accumulator. The accumulator 3, formed by an m-bit adder 4 and an m-bit register 6, operates in synchronism with a clock signal (CLK) that is also applied to the shifter 1 for synchronization. The number m is an integer greater than $\log_2 n$ (i.e., $m > \log_2 n$), where the number n is a quantity obtained by subtracting 1 from the code length of the header code to be detected. For example, if n=7, then m=3. The adder 4 sums the output of the priority encoder 2 (i.e., the 0-bit-count indication signal) and the output of the register 6. The register 6 stores the 0-bit-count indication signal from the adder 4 as an initial value, and is reset upon receipt of the 1-bit-inclusion indication signal from the priority encoder 2. The accumulator 3 accumulates the outputs of the priority encoder 2 (i.e., the 0-bit-count indication signals).

The adder 4 generates a carry signal when the sum found exceeds a set value (i.e., 7 in the decimal notation or 111 in the binary notation).

10 is a 3-bit comparator. 11 is a 1-bit register. The 3-bit comparator 10 makes a comparison between a sum found by the adder 4 land the predefined value (=7). The comparator 10 outputs a signal (hereinafter called the coincidence signal) if the sum =7. The 1-bit register 11 inputs a carry signal from the adder 4 and holds same.

12 is a first AND circuit serving as an outputting means. 13 is a second AND circuit serving as another outputting means. The first AND circuit 12 outputs, upon receipt of a coincidence signal from the comparator 10 and a 1-bit-inclusion indication signal from the priority encoder 2, a header detection signal. On the other hand, the second AND circuit 13 outputs, upon receipt of a carry signal from the register 11 and a 1-bit-inclusion indication signal from the priority encoder 2, a header detection signal. These two header detections signals from the first and second AND circuits 12, 13 are outputted via an OR circuit 14 to, outside the header detector 101.

17 is a +1 adder. This +1 adder 17 adds 1 to a number represented by a 0-bit-count indication signal from the priority encoder 2 and outputs a signal indicative of the sum found (hereinafter called the sum-indication signal). 18 is a selector. The selector 18 inputs the sum-indication signal from the +1 adder 17, a signal formed by a set number of bits (e.g., a 4-bit signal), and a code-length indication signal from the decoder 102, to select one of these three signals. 19 is an accumulator. This accumulator 19 inputs a signal selected by the selector 18, accumulates the values of the selected signals and outputs the result of the accumulation operation to the shifter 1 as a shift-amount signal. Additionally the accumulator 19 generates a read signal when the result of the accumulation operation exceeds the number of bits provided at a time from the buffer 100. The selector 18 and the accumulator 19 together form a shift-amount setting means 21 for setting the amount of shift with respect to the shifter 1.

20 is a controller for controlling the selector 18. This controller 20 is designed in such a way as to receive a header detection signal from the OR circuit 14 and a 1-bit-inclusion indication signal from the priority encoder 2. When receiving no header detection signal from the OR circuit 14, the controller 20 changes the way of controlling the selector 18 according to the presence or absence of a 1-bit-inclusion indication signal. When receiving no 1-bit-inclusion indication signal from the priority encoder 2, the controller 20 causes the selector 18 to choose the aforesaid 4-bit signal. When receiving a 1-bit-inclusion indication signal from the priority encoder 2, the controller 20 causes the selector 18 to choose the output of the +1 adder 17 (i.e., a sum found). When receiving a header detection signal from the OR circuit 14, the controller 20 causes the selector 18 to choose the output of the +1 adder 17, after which (i.e., after the decoder 102 is activated) the controller 20 causes the selector 18 to choose a code-length indication signal from the decoder 102.

The operation of the header detector 101 will be described by reference to FIG. 8. How a code sequence is outputted from the buffer 100 is not described here. For convenience' sake, a header code used in the embodiment is a code consisting of a series of seven 0 bits intermitted by a single 1 bit (i.e., "00000001").

At the first clock cycle, the shifter 1 outputs a first bit string, "0000". In response, the priority encoder 2 counts the number of consecutive 0 bits from the most significant bit (MSB) of the first bit string and outputs a 0-bit-count indication signal indicative of a number of 4. In this case, the priority encoder 2 outputs no 1-bit-inclusion indication signal having a value of 0 since the first bit string does not include a 1 bit. The register 6 is reset to zero at the first clock cycle.

At the second clock cycle, the selector 18 selects a 4-bit signal and outputs same, under the control of the controller 20. In response, the shifter 1 outputs a second bit string, "1000". The priority encoder 2 counts the number of consecutive 0 bits from the MSB of the second bit string and outputs a 0-bit-count indication signal indicative of a number of 0. This time the priority encoder 2 outputs a 1-bit-inclusion indication signal having a value of 1. The register 6 has stored a number of 4 found one clock cycle earlier, and the adder 4 performs an add operation of 4+0 (=4). The sum found (i.e., 4) is compared by the comparator 10 with the set value, 7. The comparator 10 outputs no coincidence signal, so that the first AND circuit 12 outputs no header detection signal.

At the third clock cycle under the control of the controller 20, the selector 18 selects the output of the +1 adder 17 and outputs same. The shifter 1 outputs a third bit string, "0000". In response, the priority encoder 2 counts the number of consecutive 0 bits and outputs a 0-bit-count indication signal indicative of a number of 4. At this time the priority encoder 2 outputs no 1-bit-inclusion indication signal, The register 6 has been emptied of the previously stored number or been reset to zero due to the 1-bit-inclusion indication signal generated one clock cycle earlier, and the adder 4 performs an add operation of 0+4. The sum thus found (i.e., 4) is compared by the comparator 10 with the set value (i.e., 7). The comparator 10 outputs no coincidence signal, and the first AND circuit 12 outputs no header detection signal.

At the fourth clock cycle, the selector 18 selects a 4-bit signal and outputs same. In response, the shifter 1 outputs a fourth bit string, "0100". The priority encoder 2 counts the number of consecutive 0 bits and outputs a 0-bit-count indication signal indicative of a number of 1. At this time the priority encoder 2 outputs a 1-bit-inclusion indication signal, Since the register 6 has stored a number of 4, the adder 4 performs an add operation of 4+1. The sum thus found (i.e., 5) is compared by the comparator 10 with the set value, 7. The comparator 10 outputs no coincidence signal and the first AND circuit 12 outputs no header detection signal.

At the fifth clock cycle, the selector 18 selects the output of the +1 adder 17 (i.e., a 2-bit signal) and outputs same. In response, the shifter 1 outputs a fifth bit string, "0000" (i.e., the first half of the header code). The priority encoder 2 counts the number of consecutive 0 bits and outputs a 0-bit-count indication signal indicative of a number of 4. At this time the priority encoder 2 outputs no 1-bit-inclusion indication signal. The register 6 has been reset to zero due to the 1-bit-inclusion indication signal generated one clock cycle earlier. The adder 4 performs an add operation of 0+4. The sum thus found (i.e., 4) is compared by the comparator 10 with the set value, 7. The comparator 10 outputs no coincidence signal, and the first AND circuit 12 outputs no header detection signal.

At the sixth clock cycle, the selector 18 selects a 4-bit signal and outputs same. In response, the shifter 1 outputs a sixth bit string, "0001" (i.e., the second half of the header code). The priority encoder 2 counts the number of consecutive 0 bits and outputs a 0-bit-count indication signal indicative of a number of 3. At this time the priority encoder 2 outputs a 1-bit-inclusion indication signal. Since the register 6 has stored a number of 4, the adder 4 performs an add operation of 4+3. The sum thus found (i.e., 7) is compared by the comparator 10 with the predefined value of 7. The comparator 10 outputs a coincidence signal. Upon receipt of both the coincidence signal from the comparator 10 and the 1-bit-inclusion indication signal from the priority encoder 2, the first AND circuit 12 outputs a header detection signal to the decoder 102. This header detection signal activates the decoder 102.

Thereafter, under the control of the controller 20, the selector 18 selects the output of the +1 adder 17 in the form of a 4-bit signal and outputs same. This causes the shifter 1 to shift out the second half of the header code. Then the shifter 1 outputs a bit string made up of 4 bits following the header code the next time. The decoder 102 decodes that bit string from the shifter 1 and outputs a code length signal indicative of the length of the code decoded. The selector 18 is controlled by the controller 20 in such a way as to select the code length signal from the decoder 102 and output same. As a result, the shifter 1 outputs a bit string made up of 4 bits including a code placed next to the aforesaid decoded code.

For the case of the FIG. 8 code sequence, the present embodiment requires only six clock cycles to detect a header code versus 19 clock cycles for the prior art; technique previously described. Therefore the present embodiment speeds up the rate of retrieval of header codes, without requiring the shifter 1 and the accumulator 3 to operate at a higher speed.

Additionally, only one clock cycle is required for the shifter 1 to shift out an already-decoded code. On the other hand, conventionally, the same number of clock cycles as the number of bits forming an already-decoded code is required. In the present invention, the header detector 101 outputs codes to the decoder 102 at more frequent intervals, whereupon the decoder 102 can execute decoding operation at high speed.

PREFERRED EMBODIMENT 2

Figure 9:
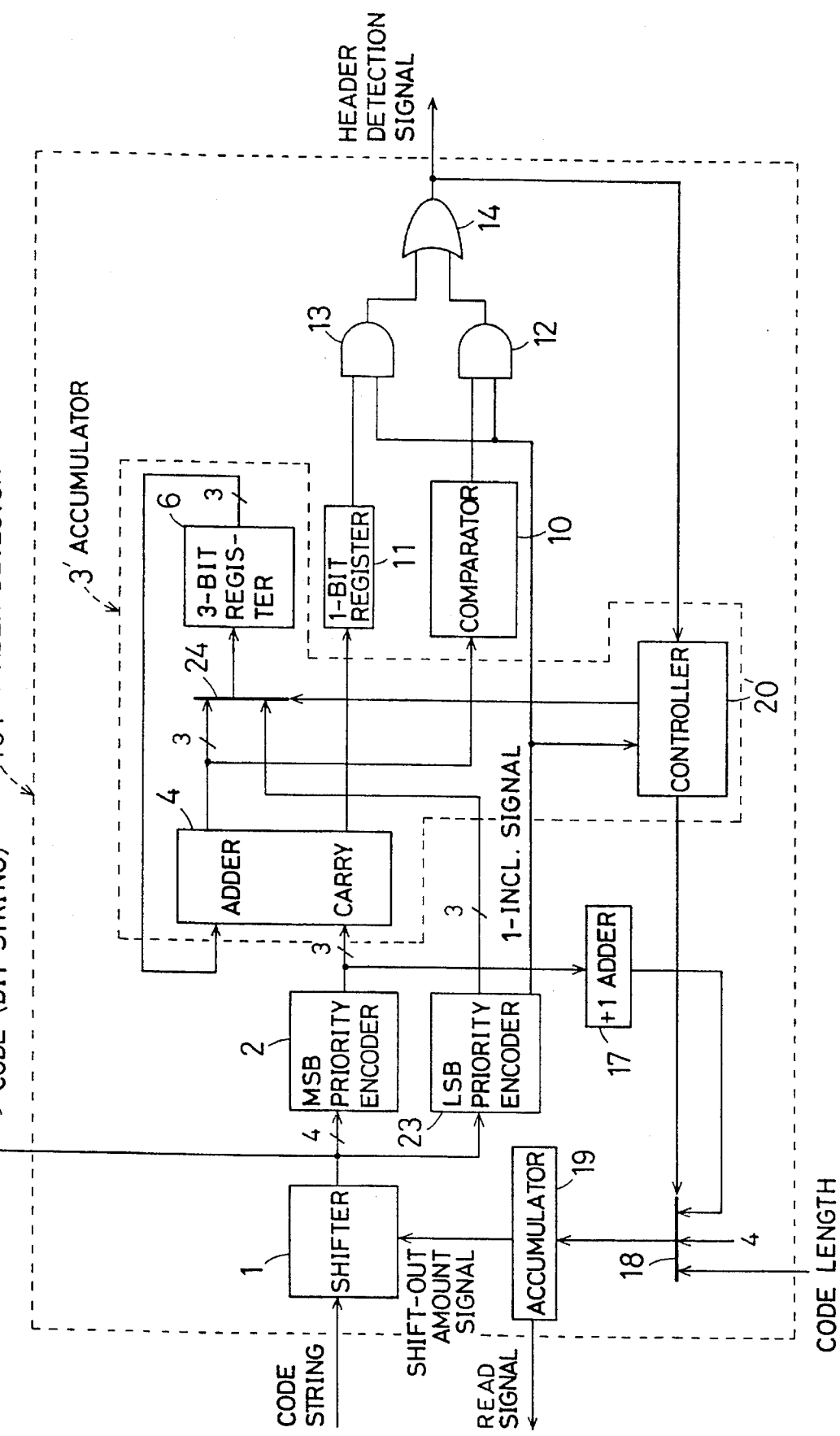
FIG. 9 shows a header detector of the second preferred embodiment.

FIG. 9 shows a second preferred embodiment of the present invention. Compared with the first embodiment, the second embodiment is characterized in that it employs a second priority encoder capable of receiving a bit string from the shifter 1 and counting the number of consecutive 0 bits from the least significant bit (LSB) of the bit string. Additionally, an improvement of the accumulator 3 of the first embodiment, or an accumulator 3' is used to perform header code detection operation at a higher speed. If the shifter 1 outputs a bit string that includes a 1 bit, then the accumulator 3' takes, as its initial value, a number indicative of the number of consecutive 0 bits from the least significant bit of that bit string and adds that number to another number indicative of the number of consecutive 0 bits from the MSB of the next bit string from the shifter 1.

23 is a priority encoder. This priority encoder 23 receives a bit string from the shifter 1 and counts the number of consecutive 0 bits from the LSB of that bit string (see the truth table of FIG. 10). In She first embodiment, the 1-bit inclusion indication signal is generated by the priority encoder 2, however, in the second embodiment, it is the priority encoder 23 that generates 1-bit-inclusion indication signals. A detection means is formed by these two priority encoders 2 and 23.

As shown in FIG. 9, the accumulator 3' has the adder 4, the 3-bit register 76, a selector 24 with two input terminals and one output terminal, and a controller 20'. The selector 24 receives the output of the adder 4 at one of the two input terminals and the output of the priority encoder 23 at the other input terminal. The output of the selector 23 is applied at the output terminal to the 3-bit register 6. The controller 20' controls the selector 24 as follows. In the absence of the 1-bit-inclusion indication signal, the controller 20' causes the selector 24 to choose the output of the adder 4. On the other hand, in the presence of the 1-bit inclusion indication signal, the controller 20' causes-the selector 24 to choose the output of the priority encoder 23 (i.e., the 0-bit-count indication signal indicative of the number of consecutive 0 bits from the LSB of the bit string) which is stored in the 3-bit register 6.

Regardless of the presence or absence of the 1-bit-inclusion indication signal, the controller 20' causes the selector 18 to choose a 4-bit signal in the absence of the header detection signal. In the presence of the header detection signal, the controller 20' causes the selector 18 to choose the output of the +1 adder 17 (i.e., the sum found). After having received the header detection signal, the controller 20' causes the selector 18 to choose the output of the decoder 102 (i.e., the code length). Other components of the second embodiment which are counterparts of the first embodiment are assigned the same reference numerals, and their description is omitted.

Referring to the FIGS. 11 and 12, the operation of the second embodiment will now be described below. FIG. 11 shows an example of the operation in the situation where the comparator 10 outputs a coincidence signal indicating that a header code has been detected. FIG. 12 shows an example of the operation in the situation where a carry is generated in the adder 4 indicating that a header code has been detected.

The description will be made taking the case of a code sequence as shown in FIG. 11. Note that until a header detection signal is outputted the selector 18 keeps selecting and outputting signals made up of a set number of bits (i.e., 4-bit signals) under the control of the controller 20'.

At the first clock cycle, the shifter 1 outputs a first bit string, "0000". In response, the priority encoder 2 counts the number of consecutive 0 bits from the MSB of the first bit string and outputs a number of 4. Likewise, the priority encoder 23 counts the number of consecutive 0 bits from the LSB of the same bit string and outputs a number of 4. At this time the priority encoder 3 outputs no 1-bit-inclusion indication signal. At the first clock cycle, the register 6 is reset to zero.

At the second clock cycle, the shifter 1 outputs a second bit string, "1000". Whereas the priority encoder 2 counts the number of consecutive 0 bits from the MSB of the second bit string and outputs a number of 0, the priority encoder 23 counts the number of consecutive 0 bits from the LSB of the second bit string and outputs a number of 3 together with a 1-bit-inclusion indication signal. The priority encoder 23 did not generate a 1-bit-inclusion indication signal having a value of 0 at the first clock cycle, so that the selector 24 of the accumulator 3' has chosen the output of the adder 4 (i.e., the MSB 0-bit-count indication signal indicative of a number of 4). Since the register 6 has stored this number of 4, the adder 4 performs an add operation of 4 and 0. The sum found by the adder 4 (i.e., 4) is compared by the comparator 10 with the set value (i.e., 7). Then the comparator 10 will provide no coincidence signal and the first AND circuit 12 will provide no header detection signal.

At the third clock cycle, the shifter 1 outputs a third bit string, "0010". The end of the third bit string (i.e., 0) is a leading bit of the header code. In response, the priority encoder 2, on the one hand, outputs a number of 2. The priority encoder 23, on the other hand, outputs a number of 1 together with a 1-bit-inclusion indication signal. The priority encoder 23 provided a 1-bit-inclusion indication signal at the second,clock cycle, so that the selector 24 of the accumulator 3' has chosen the output of the priority encoder 23 (i.e., the LSB 0-bit-count indication signal indicative of a number of 3). The register 6 has stored this number of 3, and the adder 4 performs an add operation of 3+2. The sum found by the adder 4 (i.e., 5) is compared by the comparator 10 with the set value (i.e., 7). Then the comparator 10 will provide no coincidence signal, and the first AND circuit 12 will provide no header detection signal.

At the fourth clock cycle, the shifter 1 outputs a fourth bit string, "0000". These four 0 bits are the second to the fifth bit of the header code. In response, the priority encoder 2 outputs a number of 4. The priority encoder 23 outputs also a number of 4. At this time, the priority encoder 23 outputs no 1-bit-inclusion indication signal. The priority encoder 23 outputted a 1-bit-inclusion indication signal at the third clock cycle, so that the selector 24 of the accumulator 3' has chosen the output of the priority encoder 23 (i.e., the LSB 0-bit-count indication signal indicative of a number of 1). The register 6 has stored this number of 1. The adder 4 performs an add operation of 1 and 4. The sum found by the adder 4 (i.e., 5) is compared by the comparator 10 with the set value (i.e., 7). Then the comparator 10 will provide no coincidence signal, and the first AND circuit 12 will provide no header detection signal.

At the fifth clock cycle, the shifter 1 outputs a fifth bit string, "0010". The first three bits of the fifth bit string (i.e., "001") are the sixth to the eighth bits of the header code. In response, the priority encoder 2, on the one hand, outputs a number of 2. The priority encoder 23, on the other hand, outputs a number of 1 together with a 1-bit inclusion indication signal. The priority encoder 23 provided no 1-bit-inclusion indication signal having a value of 0 at the fourth clock cycle, so that the selector 24 of the accumulator 3' has chosen the output of the adder 4 (i.e., the MSB 0-bit-count indication signal indicative of an accumulated number of 5). The register 6 has stored this number of 5. The adder 4 performs an add operation of 5+2. The sum found by the adder 4 (i.e., 7) is compared by the comparator 10 with the set value (i.e., 7) and the comparator 10 outputs a coincidence signal. Upon receipt of the coincidence signal from the comparator 10 and the 1-bit-inclusion indication signal from the priority encoder 23, the first AND circuit 12 outputs a header detection signal. This header detection signal is fed to the decoder 102 via the OR circuit 14.

The operation of each component of FIG. 12 is identical with the operation of each component of FIG. 11 in the case where the comparator 10 outputs a coincidence signal. However, in FIG. 12, when the value of the 0-bit-count indication signal exceeds the set value (=7) causing the adder 4 to generate a carry signal, the 1-bit register 11 holds such a carry signal. As a result, the second AND circuit 13 outputs a header detection signal, and this detection signal is inputted to the decoder 102 via the OR circuit 14.

In accordance with the second embodiment detecting a header code can be done for five clock cycles (see FIGS. 11 and 12). Therefore the second embodiment is faster than the first embodiment by one clock cycle, and the rate of header code detection is improved.

In each of the first and second embodiments of the present invention, the 1-bit register 11 is arranged to hold a carry signal from the adder 4. Instead of employing the 1-bit register 11, the following configuration may be employed. That is, the adder 4 is modified to be able to deal with a much greater quantity (for example, 15). The comparator 10 compares the output of the extended adder 4 with the set value (=7) and outputs a coincidence signal when the output of the extended adder 4 is found greater than the set value.

In each of the first and second embodiments, the system is composed of hardware only. However, it may partly or entirely formed by software.

In addition, the header detector in accordance with the present invention may find applications in systems other than decoders.

The invention claimed is:

1. A header detector comprising:

a shifter for receiving a code sequence and outputting said code sequence in units of a plurality of bits, each said unit forming a bit string;

a detection means for:
 receiving each said bit string from said shifter;
 outputting a 0-bit-count indication signal indicative of the number of consecutive 0 bits from a most significant bit of each said bit string; and
 detecting whether or not each said bit string includes a 1 bit and outputting a detection-result indication signal indicative of a result of said detection operation;

an accumulator for receiving each said 0-bit-count indication signal and accumulating numbers represented by said 0-bit-count indication signals to produce an accumulating total;

a comparator for receiving said accumulating total from said accumulator, and comparing said accumulating total with a set value corresponding to a header code to be detected and outputting a compare-result indication signal indicative of a result of said compare operation; and an outputting means for outputting a header detection signal on the basis of said compare-result indication signal from said comparator and said detection-result indication signal from said detection means.

2. A header detector according to claim 1 further including:

a +1 adder for adding 1 to a number represented by said 0-bit-count indication signal from said detection means; and a shift-amount setting means for setting A shift amount to be performed by said shifter;

wherein said shift-amount setting means takes, as an incremental shift-amount, either a predefined number of bits if said detection means signals the absence of a 1 bit, or a sum produced by said +1 adder if said detection means signals the presence of a 1 bit.

3. A header detector according to claim 1 wherein:

said accumulator has:

a register for storing an initial value; and an adder for adding a number represented by said 0-bit-count indication signal from said detection means to said initial value stored in said register.

4. A header detector comprising:

a shifter for receiving a code sequence and outputting said code sequence in units of a plurality of bits, each said unit forming a bit string;

a detection means for:
 receiving each said bit string from said shifter;
 outputting a first 0-bit-count indication signal indicative of the number of consecutive 0 bits from a most significant bit of each said bit string and a second 0-bit-count indication signal indicative of the number of consecutive 0 bits from a least significant bit of each said bit string; and:
 detecting whether or not each said bit string includes a 1 bit and outputting a detection-result indication signal indicative of a result of said detection operation;

an accumulator for receiving each said first 0-bit-count indication signal and accumulating numbers represented by said first 0-bit-count indication signals to produce an accumulating total;

a comparator for receiving said accumulating total from said accumulator, and comparing said accumulating total with a set value corresponding to a header code to be detected and outputting a compare-result indication signal indicative of a result of said compare operation; and an outputting means for outputting a header detection signal on the basis of said compare-result indication signal from said comparator and said detection-result indication signal from said detection means;

wherein said accumulator takes, as its initial value, either said accumulating total when receiving said detection-result indication signal indicative of the absence of a 1 bit, or a number represented by said second 0-indication signal when receiving said detection-result indication signal indicative of the presence of a 1 bit.

5. A header detector according to claim 4 further including:

a +1 adder for adding 1 to a number represented by said 0-bit-count indication signal from said detection means; and a shift-amount setting means for setting a shift amount to be performed by said shifter;

wherein said shift-amount setting means takes, as an incremental shift-amount, either a predefined number of bits in the absence of said header detection signal from said outputting means, or a sum produced by said +1 adder in the presence of said header detection signal from said outputting means.

6. A header detector according to claim 4 wherein:

said detection means has:

a first priority encoder for receiving each said bit string from said shifter and outputting a first 0-bit-count indication signal indicative of the number of consecutive 0 bits from a most significant bit of each said bit string; and a second priority encoder for:
 receiving each said bit string from said shifter;
 outputting a second 0-bit-count indication signal indicative of the number of consecutive 0 bits from a least significant bit of each said bit string; and
 detecting whether or not each said bit string includes a 1 bit and outputting a detection-result indication signal indicative of a result of said detection operation.

7. A header detector according to claim 4 wherein:

said accumulator has:

a register for storing an initial value;

an adder for adding a number represented by said 0-bit-count indication signal from said detection means to said initial value stored in said register;

a selector for selecting between the output of said adder and said second 0-indication signal from said detection means and outputting a selection to said register; and a controller for controlling said selector;

wherein:

said controller, upon receipt of said detection-result indication signal indicative of the absence of a 1 bit, causes said selector to choose the output of said adder; and said controller, upon receipt of said detection-result indication signal indicative of the presence of a 1 bit, causes said selector to first choose the output of said adder and then said second 0-indication signal.

8. A header detector according to either claim 1 or claim 4 wherein said comparator compares said accumulating total found by said accumulator with said set value and outputs a coincidence signal when said accumulating total is found equal to said set value.

9. A header detector according to either claim 1 or claim 4 wherein said outputting means outputs a header detection signal upon receipt of said coincidence signal and said detection-result indication signal indicative of the presence of a 1 bit.

10. A header detector according to either claim 3 or claim 7 wherein:

said adder of said accumulator outputs a carry signal if a sum found by said adder exceeds said set value;

said header detector further includes:

a register for holding said carry signal from said adder; and another outputting means for outputting a header detection signal upon receipt of the output of said register and said detection-result indication signal indicative of the presence of a 1 bit.

11. A header detector according to either claim 2 or claim 5 wherein:

said header detector is associated with a decoder for decoding a code and outputting a code-length signal indicative of the length of said decoded code; and said shift-amount setting means is formed by a selector for selecting said code-length signal from said decoder after said decoder is activated.

12. A header detector according to either claim 1 or claim 4 wherein said code sequence is a bit string including a great number of codes according to Motion Picture Image Coding Experts Group image compression coding standards.

13. A decoding apparatus comprising a header detector and a decoder, said header detector including:

a shifter for receiving a code sequence and outputting said code sequence in units of a plurality of bits, each said unit forming a bit string;

a detection means for:

receiving each said bit string from said shifter;

outputting a 0-bit-count indication signal indicative of the number of consecutive 0 bits from a most significant bit of each said bit string; and detecting whether or not each said bit string includes a 1 bit and outputting a detection-result indication signal indicative of a result of said detection operation;

an accumulator for receiving each said 0-bit-count indication signal and accumulating numbers represented by said 0-bit-count indication signals to produce an accumulating total;

a comparator for receiving said accumulating total from said accumulator, and comparing said accumulating total with a set value corresponding to a header code to be detected and outputting a compare-result indication signal indicative of a result of said compare operation and an outputting means for outputting a header detection signal on the basis of said compare-result indication signal from said comparator and said detection-result indication signal from said detection means;

wherein:

said decoder is activated by said header detection signal from said outputting means of said header detector, starts decoding a code from said shifter, and outputs a code-length signal indicative of the length of said decoded code; and said shifter of said header detect or takes said code-length signal from said decoder as an incremental shift-amount.

14. A decoding apparatus comprising a header detector and a decoder, said header detector including:

a shifter for receiving a code sequence and outputting said code sequence in units of a plurality of bits, each said unit forming a bit string;

a detection means for:

receiving each said bit string from said shifter;

outputting a first 0-bit-count indication signal indicative of the number of consecutive 0 bits from a most significant bit of each said bit string and a second 0-bit-count indication signal indicative of the number of consecutive 0 bits from a least significant bit of each said bit string; and detecting whether or not each said bit string includes a 1 bit and outputting a detection-result indication signal indicative of a result of said detection operation;

an accumulator for receiving each said first 0-bit-count indication signal and accumulating numbers represented by said first 0-bit-count indication signals to produce an accumulating total;

a comparator for receiving said accumulating total from said accumulator, and comparing said accumulating total with a set value corresponding to a header code to be detected and outputting a compare-result indication signal indicative of a result of said compare operation; and an outputting means for outputting a header detection signal on the basis of said compare-result indication signal from said comparator and said detection-result indication signal from said detection means;

wherein:

said accumulator takes, as its initial value, either said accumulating total when receiving said detection-result indication signal indicative of the absence of a 1 bit, or a number represented by said second 0-indication signal when receiving said detection-result indication signal indicative of the presence of a 1 bit;

said decoder is activated by said header detection signal from said outputting means of said header detector, starts decoding a code from said shifter, and outputs a code-length signal indicative of the length of said decoded code; and said shifter of said header detector takes said code-length signal from said decoder as an incremental shift-amount.

* * * * *

UNITED STATES PATENT AND TRADEMARK OFFICE
CERTIFICATE OF CORRECTION

PATENT NO. : 5,568,140
DATED : October 22, 1996
INVENTOR(S) : IMANISHI et al.

It is certified that error appears in the above-identified patent and that said Letters Patent is hereby corrected as shown below:

Col. 11, line 49: Delete "A" and insert --a--

Col. 14, line 15: Delete "detect or" and insert --detector--

Signed and Sealed this

Twenty-second Day of September, 1998

Attest:

BRUCE LEHMAN

Attesting Officer     *Commissioner of Patents and Trademarks*